United States Patent [19]

Yu

[11] Patent Number: 4,917,624
[45] Date of Patent: Apr. 17, 1990

[54] SOCKET FOR PRINTED CIRCUIT BOARD

[76] Inventor: Mu-Gen Yu, 17-1, Alley 24, Lane 51, Shin-Sheng Rd., Tansui Chen, Taipei Hsien, Taiwan

[21] Appl. No.: 329,548
[22] Filed: Mar. 28, 1989
[51] Int. Cl.⁴ ............................................... H01R 9/09
[52] U.S. Cl. ..................................................... 439/328
[58] Field of Search ................. 439/326, 327, 328, 60, 439/61, 62, 630

[56] References Cited

U.S. PATENT DOCUMENTS

| | | | |
|---|---|---|---|
| 3,216,580 | 11/1965 | Fricker, Jr. | 439/328 X |
| 4,712,848 | 12/1987 | Edgley | 439/327 |
| 4,713,013 | 12/1987 | Regnier et al. | 439/328 X |
| 4,756,694 | 7/1988 | Billman | 439/328 X |
| 4,781,612 | 11/1988 | Thrush | 439/328 |

Primary Examiner—William Briggs
Attorney, Agent, or Firm—Lowe, Price, LeBlanc, Becker & Shur

[57] ABSTRACT

A socket of this invention includes a channel-shaped socket body with a row of cavities formed therein for receiving the conducting fingers of a printed circuit board. Two immobilizing pins having bent ends with hooking portions formed integrally therewith are provided at one side of the row of cavities. The hooking portions projects from one side of the bent portions in opposite directions relative to one another. The pins are laterally movable in all directions to facilitate disengagement of the hooking portions from the circuit board.

4 Claims, 3 Drawing Sheets

SOCKET FOR PRINTED CIRCUIT BOARD

BACKGROUND OF THE INVENTION

This invention relates to a socket for a printed circuit board, and particularly to a socket which includes immobilizing pins for the circuit board.

Printed circuit boards which are commonly used in computers are usually connected electrically to each other by means of sockets which are elongated and include a row of plug holes or cavities. A typical socket used with the printed circuit boards is shown in FIGS. 1 and 2. This socket includes a base 90 with a row of socket holes 92 for receiving fingers of a printed circuit board 95, as well as two guide plates 91 and two clamp blocks 93 for holding the circuit board between them. The guide plates 91 are provided with engaging pins 99 to engage in holes 96, 97 of the circuit board. Such a socket cannot immobilize the printed circuit board. Therefore, the board is easily loosened and moved by an external force, adversely affecting the performance of a computer which includes such a socket. Moreover, it is inconvenient for a person to attach a circuit board to this socket because an additional person is required to help him to push the guide plates 91 slightly away from the circuit board when the board is inserted to the socket.

SUMMARY OF THE INVENTION

It is an object of the present invention to provide an improved socket which can be conveniently attached to and effectively immobilize the circuit board.

According to the present invention, a socket for a printed circuit board comprises an elongated channel-shaped socket body having two opposite ends, and a base with a row of cavities for receiving one side of the circuit board which bears conductors for electrical connection; two immobilizing pins provided at one side of the row of cavities and arranged in positions substantially parallel to the printed circuit board, each of the pins having both a bent end to be inserted into a hole provided in the printed circuit board, and a hooking element formed on the bent end, the pins also having a degree of resiliency so as to be movable in all lateral directions.

In one aspect of the invention, the bent ends of the pins extend along lines substantially normal to the printed circuit board, and the hooking elements project from one side of the bent ends in opposite directions relative to one another.

The immobilizing pins may either be substantially normal to the base of the socket body or inclined to the base. In a case where the immobilizing pins are inclined, two guide plates are provided at the other side of the row of cavities at positions substantially parallel to the immobilizing pins.

The present exemplary preferred embodiments will be described in detail with reference to the accompanying drawings, in which:

DETAILED DESCRIPTION OF THE PREFERRED EMBODIMENTS

Figure 1:
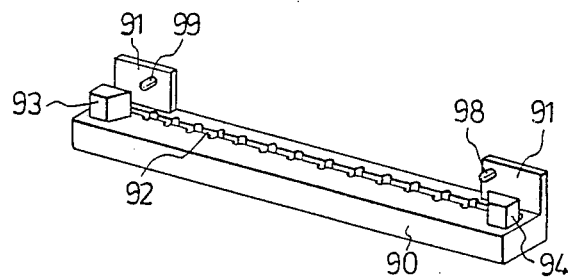
FIGS. 1 and 2 show a conventional socket.
Figure 2:
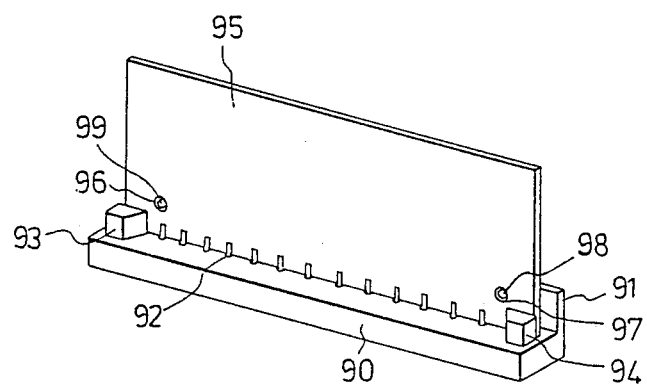
Figure 3:
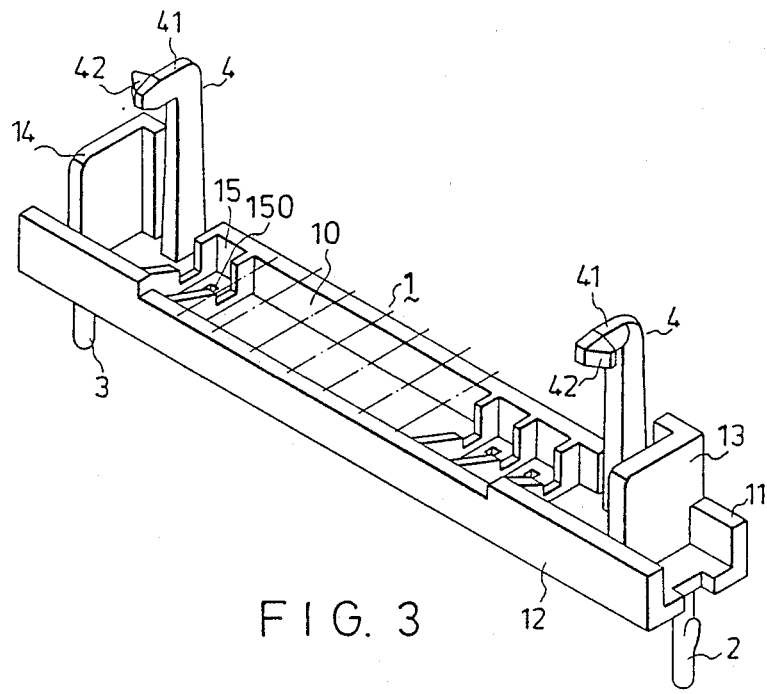
FIG. 3 is a perspective view of a socket incorporating the present invention.
Figure 4:
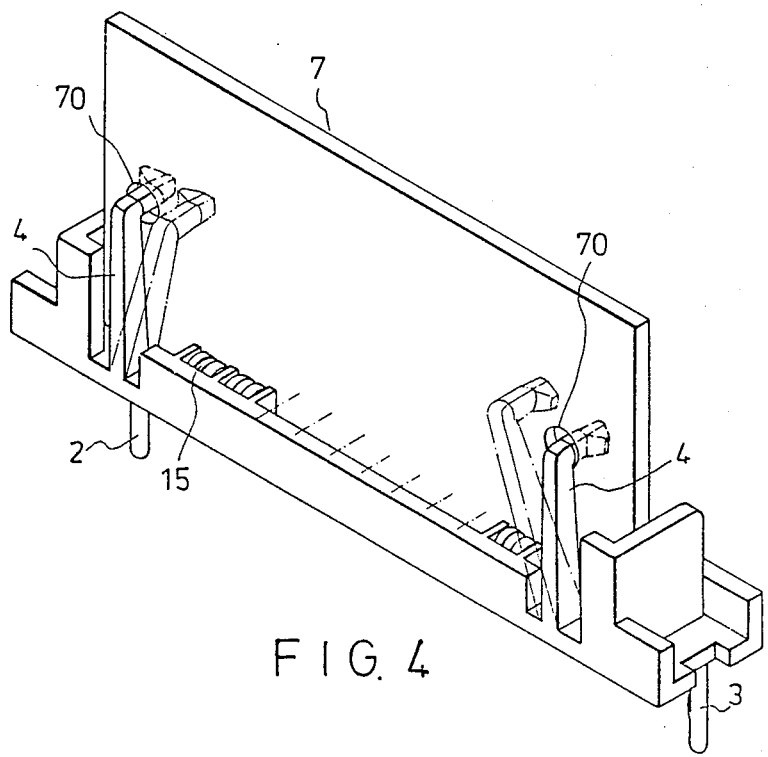
FIG. 4 shows the socket of FIG. 2 to which a printed circuit board is attached.

Referring to FIGS. 3 and 4, a socket body 1 is shown, including two insert legs 2, 3 to be attached to a printed circuit board (not shown). The socket body 1 has a conventional channel construction including a channel 10 confined by two parallel panel members 11, 12. Two transverse end plates 13, 14 having an L-shaped cross-section, are provided at the two ends of the socket body.

In the channel 10 of the socket body are provided a plurality of cavities 15 and spring clamping elements (not shown) for receiving one side of a printed circuit board 7 whose fingers (not shown) are threaded through holes 150 of the socket body.

The present invention is characterized in that two immobilizing pins 4 having a degree of resiliency are integrally formed with the socket body 1 near the ends of the socket body 1. Each immobilizing pin 4 is substantially normal to the base of the socket body 1 so as to be arranged substantially parallel to the printed circuit board 7, and has a bent end 41 to be inserted into a hole 70 of the circuit board 7. The bend end 41 of each pin 4 has a hook portion 42 thereon each having a shape of a truncated pyramid. The hook portions 42 of the pins 4 project from the bent ends of the pins in opposite directions relative to one another.

When a printed circuit board is to be inserted into the socket incorporating the present invention, the user may insert the board into the socket body with one of his hands and slightly pull the two pins 4 both outward and toward one another so as to prevent the pins from engaging the board. Then, the pins 4 are released and caused to engage in the holes 70 of the board 7. It can be appreciated that it is convenient for one person to attach a printed circuit board to the socket incorporating the present invention without requiring the aid of another person.

Figure 5:
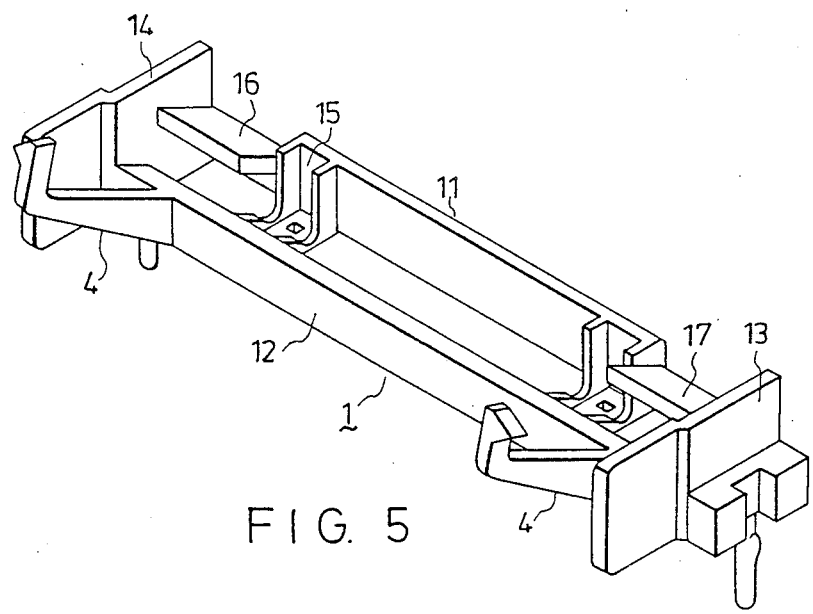
FIGS. 5 and 6 shows another socket incorporating the present invention.
Figure 6:
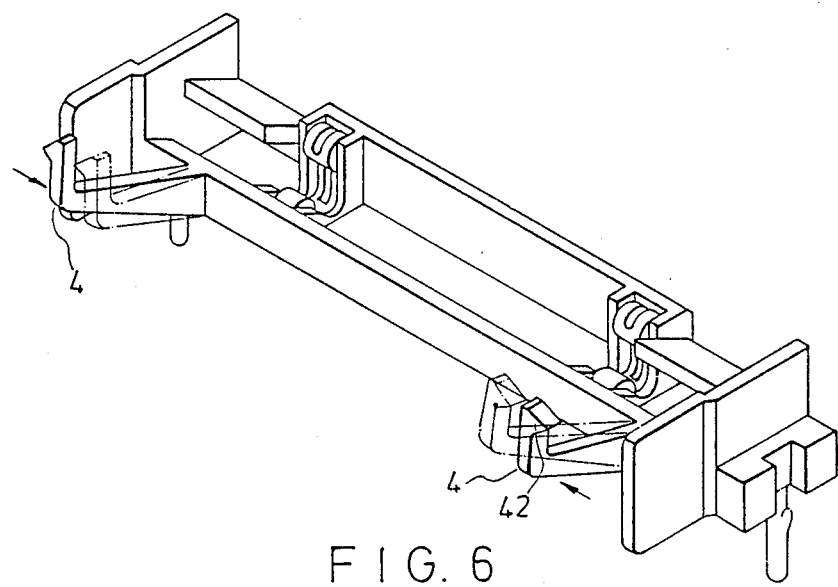

FIG. 5 shows another embodiment of the present invention which includes a socket body 1 having two parallel plates 11 and 12 confining a channel. Two transverse plates 13 and 14 are provided at the ends of the socket body and project outwardly from the plate 12. Two angled guide plates 16 and 17 are provided at one side of aligned cavities 15, and immobilizing pins 4 which are provided at the other side of the aligned cavities 15 form an angle with the base of the socket body. The guide plate 16 or 17 is substantially parallel to each pin 4. The socket of this embodiment can be used for an inclined printed circuit board. In this case, the attaching operation of this embodiment is similar to that of the previous embodiment.

With the invention thus explained, it is apparent that various modifications and variations can be made without departing from the scope of the invention. It is therefore intended that the invention be limited only as indicated in the appended claims.

What I claim is:

1. A socket for a printed circuit board comprising:
    a socket body defining an elongated channel having two opposite ends, said body having a base with a row of cavities for receiving one side of the circuit board which bears conductors for electrical connection; and two immobilizing pins which are provided at one side of the row of cavities adjacent to said ends of said socket body and are arranged in positions substantially parallel to the printed circuit board, each of said pins having both a bent end to be inserted into a hole provided in the printed circuit board, and a hooking element formed on said bent end, said pins having a substantial degree of resiliency so as to be movable along a line substantially parallel to the channel in said body to facilitate engagement and disengagement with the printed circuit board said bent ends extending along lines substantially normal to the printed circuit board, and said hooking elements projecting from one side of said bent ends in opposite directions relative to one another, said hooking elements extending along a line substantially parallel to the channel in said base of said socket body.

2. A socket as claimed in claim 1, wherein said immobilizing pins are substantially normal to said base.

3. A socket as claimed in claim 1, wherein said immobilizing pins extend along lines inclined to said base.

4. A socket as claimed in claim 3, further comprising two guide plates provided at the other side of said row of cavities and substantially parallel to said immobilizing pins.

* * * * *